United States Patent [19]

Misiano et al.

[11] 4,082,637
[45] Apr. 4, 1978

[54] PROCESS FOR MANUFACTURING SEMICONDUCTOR STRUCTURES BY SPUTTER ETCHING

[75] Inventors: Carlo Misiano; Karl Heinz Diedrich; Enrico Simonetti, all of Rome, Italy

[73] Assignee: Selenia-Industrie Elettroniche Associate S.p.A., Naples, Italy

[21] Appl. No.: 730,542

[22] Filed: Oct. 7, 1976

[30] Foreign Application Priority Data
Nov. 24, 1975 Italy ................................. 52375 A/75

[51] Int. Cl.$^2$ ............................................. C23C 15/00
[52] U.S. Cl. ................................................ 204/192 E
[58] Field of Search ..................... 204/192 E, 192 EC

[56] References Cited
U.S. PATENT DOCUMENTS
3,868,271   2/1975   Poley et al. .............................. 134/1

OTHER PUBLICATIONS
R. T. Tsui et al., "Removal of Polymerized Photoresists by Atomic & Molecular Hydrogen in a Discharge," IBM Tech. Disc. Bull., vol. 9, Feb. 1967, p. 122.

Primary Examiner—Aaron Weisstuch
Attorney, Agent, or Firm—Beveridge, DeGrandi, Kline & Lunsford

[57] ABSTRACT

A process for manufacturing semiconductor devices, particularly monocrystalline structures by sputter etching, wherein the electric discharge is effected in a rarefied atmosphere, the components of which are Argon and Hydrogen, or Argon and $H_2O$, or inert gas and a gas developing Hydrogen ions.

12 Claims, 1 Drawing Figure

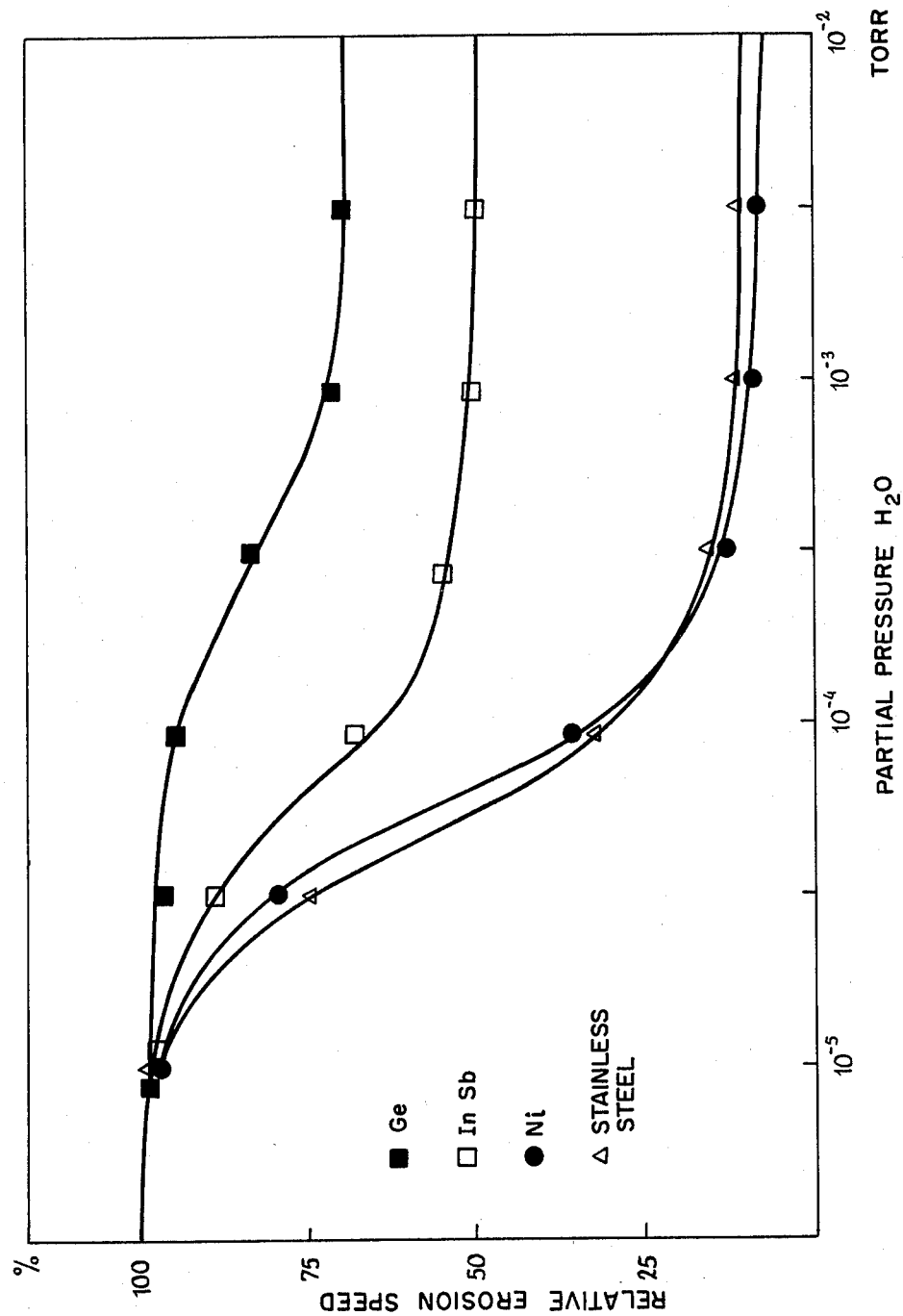

PROCESS FOR MANUFACTURING SEMICONDUCTOR STRUCTURES BY SPUTTER ETCHING

BACKGROUND OF THE INVENTION

The present invention relates to an improvement in the processes for manufacturing semiconductor devices, particularly in the sputter etching processes.

More particularly, the present invention relates to an improvement in the processes of sputter etching particularly suitable to embody structures on monocrystalline materials, specifically on composite semiconductors suitable to embody detectors of infra-red radiation.

The usual used techniques for shaping structures on materials in massive form, particularly monocrystalline materials, are chemical etching and electrochemical etching.

These conventional techniques suffer from various drawbacks, e.g. underetching of the material, formation of point-like pitting, attack along crystallographic preferential directions and preferential attack along dislocation lines and other imperfections of the crystal lattice.

When the material is removed by sputter etching, these drawbacks will not occur. However, other problems arise, generally attributed to cross contamination between the processed material and the masking material.

This phenomenon occurs mainly when a processed material which is etched at a relatively high speed is exposed to surface contamination due to back scattering of the masking material which will be etched at a relatively low speed.

This contamination produces characteristic cone formations on the processed material, causing surface roughness, discolouring, slowing of the etching speed and non repeatability of the process.

SUMMARY OF THE INVENTION

According to the present invention, the sputter etching is effected in a controlled atmosphere consisting preferably of an Argon/Hydrogen mixture, or of Argon/$H_2O$ mixture.

BRIEF DESCRIPTION OF THE DRAWING

The FIGURE shows the variation of the etch rate of the Ge, InSb, Ni and stainless steel as a function of $H_2O$ partial pressure.

In order to better clarify the process according to the present invention, certain tests will be now disclosed as effected on samples of Ge and InSb using a film of electrolytic Nickel as masking material.

Satisfactory results have been obtained on both Ge and InSb with th use of mixtures of Ar + $H_2$ and Ar + $H_2O$ as specimens have been obtained with complete repeatibility, totally free from surface alterations even when sputtering continued for several hours. In these tests, the etching speed of the Ge and InSb samples appeared to be two or three times higher than that obtained when Argon/$H_2O$ is used.

In a first test with Ge a gaseous mixture has been used consisting of 5 millitorr of Argon and 2 millitorr of $H_2O$.

Similar results have been obtained by using a mixture of 5 millitorr of Argon and 5 millitorr of Hydrogen.

In a second test with InSb a gaseous mixture of the same kind has been used with equally satisfactory results.

The attached drawing shows the trend of the sputter etching speed for various materials, e.g. Ge, InSb, Ni, and stainless steel, versus the partial pressure of $H_2O$ in a basic atmosphere of 5 millitorr Argon. The curves shown in the FIGURE are standardized with respect to the maximum sputter etch rate in a pure Argon atmosphere.

The representative curves of the attached drawing relate to an power density on the cathode equalling 2.4 Watt/$cm^2$ and a distance between the electrodes of about 6 centimeters.

The process according to this invention, although applicable to the manufacture of semiconductor devices, is particularly suitable to the manufacture of detectors for infrared radiation made of InSb, as this process does not alter the intrinsic properties of the material, maintaining unaltered its electro-optical characteristics.

Having thus described the present invention, what is claimed is:

1. A process for manufacturing a semiconductor monocrystalline structure by sputter etching a semiconductor substrate material having a masking material thereon, said process comprising sputter etching said substrate material with an electric discharge at a higher rate than said masking material is etched, in a rarefied atmosphere of:
   (a) Argon and hydrogen; or
   (b) Argon and $H_2O$; or
   (c) an inert gas and a gas developing hydrogen ions to thereby reduce surface contamination of said substrate material by back scattering of said masking material.

2. Process according to claim 1 wherein said substrate material is selected from the group consisting of Ge and InSb and said masking material is Ni.

3. Process according to claim 1 wherein said substrate material is Ge, said masking material is Ni and said process is performed in a rarefied atmosphere of 5 millitorr of Argon and 2 millitorr of $H_2O$.

4. Process according to claim 1 wherein said substrate material is Ge, said masking material is Ni and said process is performed in a rarefied atmosphere of 5 millitorr of Argon and 5 millitorr of $H_2O$.

5. Process according to claim 1 wherein said substrate material is InSb, said masking material is Ni and said process is performed in a rarefied atmosphere of 5 millitorr of Argon and 2 millitorr of $H_2O$.

6. Process according to claim 1 wherein said substrate material is InSb, said masking material is Ni and said process is performed in a rarefied atmosphere of 5 millitorr of Argon and 5 L millitorr of $H_2O$.

7. Process according to claim 1 in which said process is performed in an atmosphere of Argon and hydrogen ions.

8. Process according to claim 7 in which said hydrogen ions are produced by hydrogen gas ionized by said electric discharge.

9. Process according to claim 7 wherein said hydrogen ions are provided by $H_2O$, which is dissociated by said electric discharge.

10. Process according to claim 1 in which said Argon and hydrogen or said Argon and $H_2O$ are present in said rarefied atmosphere in comparable portions, measured according to their partial pressures.

11. Process according to claim 10 in which said partial pressures are in the range from 0.5 to 50 millitorr.

12. Process according to claim 10 in which said partial pressures are about 3 to about 15 millitorr.

* * * * *